United States Patent

Chia et al.

[11] Patent Number: 5,973,393
[45] Date of Patent: Oct. 26, 1999

[54] APPARATUS AND METHOD FOR STACKABLE MOLDED LEAD FRAME BALL GRID ARRAY PACKAGING OF INTEGRATED CIRCUITS

[75] Inventors: Chok J. Chia, Cupertino; Seng-Sooi Lim, San Jose; Qwai H. Low, Cupertino, all of Calif.

[73] Assignee: LSI Logic Corporation, Milpitas, Calif.

[21] Appl. No.: 08/771,636

[22] Filed: Dec. 20, 1996

[51] Int. Cl.$^6$ .............................. H01L 23/02; H01L 23/28
[52] U.S. Cl. ..................... 257/690; 257/676; 257/672; 257/686; 257/722
[58] Field of Search ................................ 257/690, 676, 257/672, 686, 722, 724

[56] References Cited

U.S. PATENT DOCUMENTS

| | | | |
|---|---|---|---|
| 5,197,183 | 3/1993 | Chia et al. | 29/827 |
| 5,435,482 | 7/1995 | Variot et al. | 228/254 |
| 5,461,197 | 10/1995 | Hiruta et al. | 257/690 |

FOREIGN PATENT DOCUMENTS

| | | | |
|---|---|---|---|
| 359161851 | 9/1984 | Japan | 257/696 |
| 363300543 | 12/1988 | Japan | 257/690 |
| 403078245 | 4/1991 | Japan | 257/693 |
| 403206652 | 9/1991 | Japan | 257/731 |

*Primary Examiner*—Teresa M. Arroyo
*Assistant Examiner*—Hung Van Duong

[57] ABSTRACT

An apparatus and method for packaging an integrated circuit having a semiconductor die with electronic circuitry disposed thereon includes lead frames for mounting thereon solder balls of a ball grid array packaging structure. In one embodiment, the semiconductor die is coupled to conductors of the lead frame via gold wires attached to both the semiconductor die and the lead frame. The lead frame is encapsulated in plastic with apertures disposed therein for exposing upper and lower portions of conductors of the lead frame. The apertures are filled with solder balls to contact both the upper and lower portions of the lead frame conductors. Solder balls on the top of one integrated circuit package may be connected to mating solder balls on the bottom of another integrated circuit package, and so on, thereby achieving multiple stacking of integrated circuit packages.

4 Claims, 2 Drawing Sheets

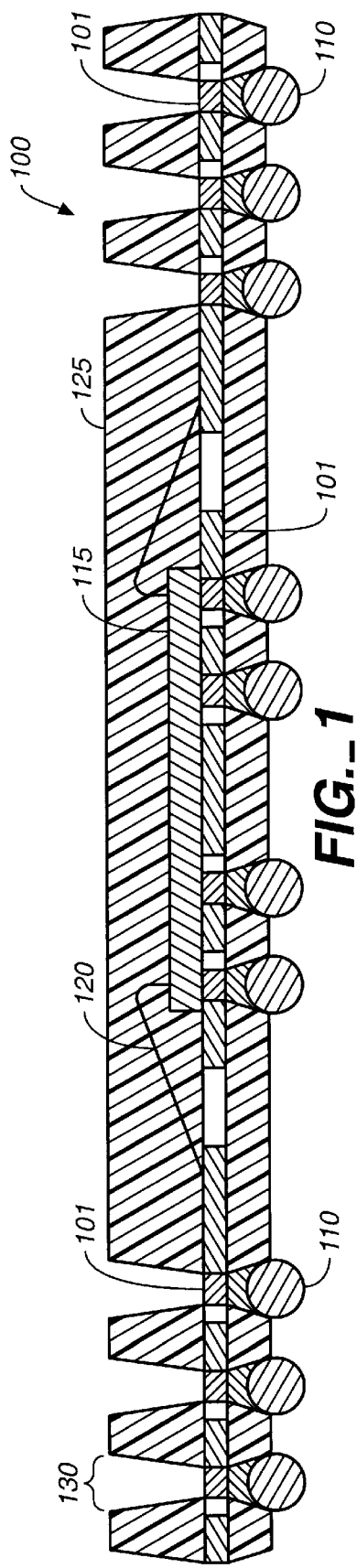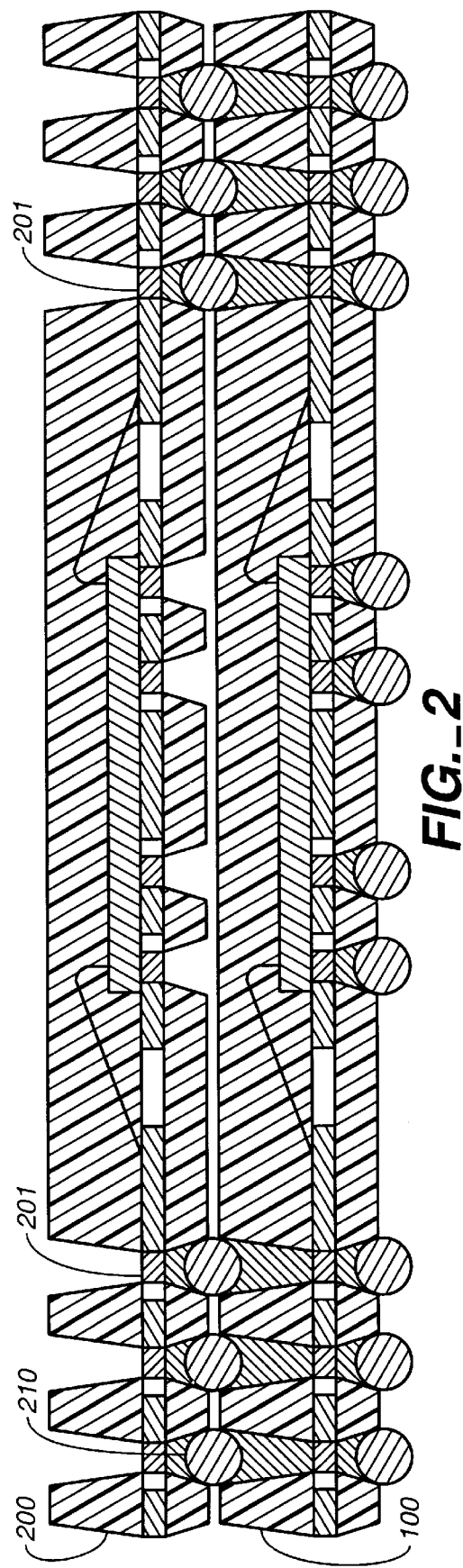

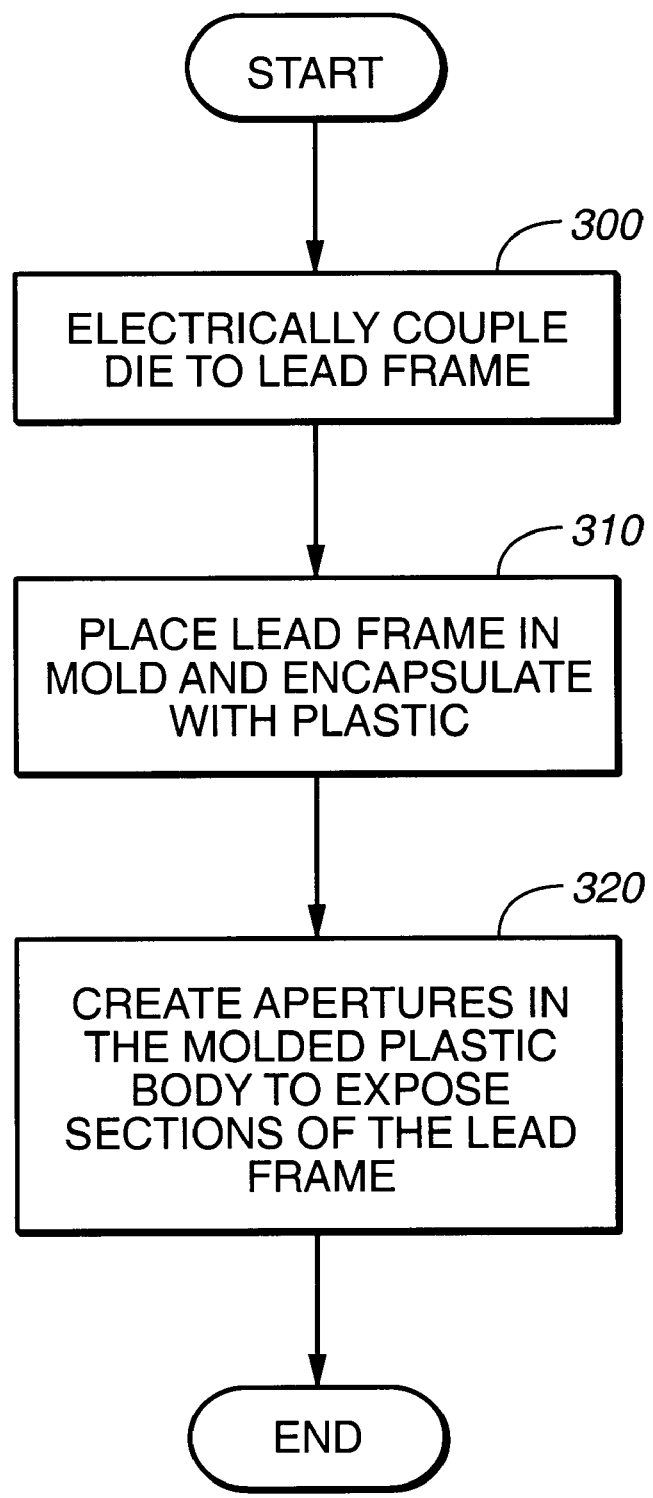
FIG._3

5,973,393

APPARATUS AND METHOD FOR STACKABLE MOLDED LEAD FRAME BALL GRID ARRAY PACKAGING OF INTEGRATED CIRCUITS

BACKGROUND OF THE INVENTION

1. Field of the Invention

This invention relates to packaging of semiconductor integrated circuits, and more particularly to apparatus and method including the use of lead frames in place of substrates for mounting solder balls of ball grid array packages.

2. Description of the Related Art

Ball grid array packaging of semiconductor integrated circuits uses an array of solder balls on the bottom of the package as leads for connection of the semiconductor integrated circuit (IC) to external components. An array of solder balls on the bottom surface of the package results in higher density packaging and are easier to use since they can be more widely separated.

Currently, ball grid array packages are constructed with the semiconductor die mounted on one face of a substrate, and the solder balls mounted on the opposite face of the substrate. Circuitry on the substrate provides the necessary interconnection between the die and solder balls. Substrates are currently made of either ceramic, printed circuit board (PCB) lamninate, or flexible, plastic tape.

Ceramic substrates in ball grid array packaging typically suffer from reliability problems when mounted to PCB mother boards due to a thermal expansion mismatch of the ceramic and the PCB. Also, for either ceramic, PCB laminate, or tape substrates, only one surface has solder balls, so the packages cannot be conveniently stacked. Thus, current ball grid array packaging does not provide for increased package mounting density and less board space usage which results from stacking packages.

SUMMARY OF THE INVENTION

Accordingly, in accordance with one embodiment of the present invention, a lead frame is utilized in place of a substrate in a ball grid array package to allow solder balls to be mounted to both the top and the bottom of an IC package. Solder balls on the top of one IC package may then be connected to matching solder balls on the bottom of another IC package, and so on, achieving multiple stacking of IC packages. Thus, the present invention provides for stacking of multiple IC packages for increased mounting density and less board space usage. In particular, the semiconductor die is coupled via electrically conducting wires to a lead frame having a plurality of conductors. Each conductor of the plurality of conductors has an upper and lower portion. The semiconductor die and lead frame are encapsulated by a molded plastic housing which includes apertures disposed therein for exposing both the upper and lower portions of the lead frame conductors. Solder balls may then be attached to either or both of the upper and lower portions of the conductors. Solder balls of the upper portions of conductors of one IC package may then be attached to the solder balls of lower portions of conductors of another IC package to achieve multiple stacking of the packages.

BRIEF DESCRIPTION OF THE DRAWINGS

FIG. 1 is a partial sectional view of an IC package utilizing ball grid array packaging according to the present invention;

FIG. 2 is a partial sectional view of two stacked IC packages, each utilizing the ball grid array packaging according to the present invention; and FIG. 3 is a flow chart illustrating a method for forming a ball grid array package according to the present invention.

DETAILED DESCRIPTION OF THE INVENTION

Referring now to FIG. 1, there is shown a portion of an IC package 100 having a lead frame 101 disposed in place of a substrate 105 for coupling solder balls 110 to a semiconductor die 115. The lead frame 101 includes a plurality of conductors having upper and lower portions. The lead frame 101 is electrically connected to portions of active circuitry (not shown) formed on the surface of the die 115. Such electrical connection is accomplished via bonded wires 120 which are electrically coupled in a conventional manner to the lead frame 101 at one end and to a contact pad on the die 115 at the other end. In a preferred embodiment, the bonded wires 120 are made of gold.

The semiconductor die 115 is encapsulated by molded plastic which forms a housing 125 for the die 115, the lead frame 101, and the bonded wires 120. The molded plastic housing 125 is formed using a conventional molded package assembly technique such as that described in U.S. Pat. No. 5,197,183 to Chia et al. entitled "Modified Lead Frame For Reducing Wire Wash in Transfer Molding of IC Packages", which is incorporated herein by reference. In particular, the molded package assembly technique uses a molding compound such as a polymer that is solid at room temperature. The polymer is then melted and transferred to a mold usually made of steel. The mold has a top and bottom half, and the cavities of the halves define the size, shape, and surface finish of the IC package.

Preferably, both upper and lower portions of conductors of the lead frame 100 are exposed through apertures 130 in the molded plastic housing 125. These apertures 130 are formed through the use of an array of stubs on both the top and bottom mold cavity halves which contact sections of the lead frame 101 during formation of the molded plastic housing 125. The apertures 130 are preferably used for attaching the solder balls 110 to the lead frames 101 to form the ball grid array package according to the present invention. The electronic circuitry disposed on the semiconductor die 115 is connected to components external to the housing 125 via the connection of the solder balls 110 to the lead frame 101.

The solder balls are formed according to conventional techniques, such as that described in U.S. Pat. No. 5,435,482 to Variot et al. entitled "Integrated Circuit Having a Coplanar Solder Ball Contact Array", which is incorporated herein by reference. In particular, the IC package 100 typically is mounted to a circuit board (not shown) which has an array of electrical contacts. Pads of solder paste (solder particles in a paste flux) are applied to the electrical contacts, and the solder balls 110 contact the pads of solder paste when the IC package 100 is placed on the circuit board. The circuit board and the IC package 100 are then placed in a solder reflow furnace, at a temperature and for a time sufficient to reflow the solder balls and to coalesce the solder particles of the solder paste into a solder connection with the solder balls of the IC package. The solder balls 110 are preferably pre-made by Alpha Metals of Irvine, Calif.

Referring now to FIG. 2, there is shown a partial sectional view of the first IC package 100 and a second IC package 200 stacked on top of the first package 100. Each of the packages 100, 200 utilizes the ball grid array packaging according to the present invention. The packages 100, 200 are preferably stacked by connecting the solder balls 110 coupled to the upper portion of conductors of the lead frame 101 of the first package 100 to matching solder balls 210 coupled to the lower portion of conductors of the lead frame 201 of the second package 200. In this way, stacking of the packages 100, 200 may be achieved, resulting in increased mounting density of the packages 100, 200 and less board space usage. For illustrative purposes, two stacked packages 200, 210 are shown, however more than two packages may be stacked, achieving even further increased mounting density.

The solder balls 110 of the first package 100 are coupled to the matching solder balls 210 of the second package 200 using solder paste and a similar reflow technique as discussed previously.

Referring now to FIG. 3, a flow chart is shown illustrating a method for forming a ball grid array package according to the present invention. Specifically, the die 115 is first electrically coupled 300 to the lead frame 101 via the bonded wire 120. The lead frame 101 is then placed in a mold and encapsulated 310 with plastic using a conventional molded package assembly technique. Using the array of stubs on both mold cavity halves, apertures 130 are created 320 in the molded plastic body 125 for exposing sections of the lead frame 101. These apertures 130 are used for attaching the solder balls 110 to the lead frame 101 to form the ball grid array package.

Therefore, the present invention provides a very reliable apparatus and method for packaging integrated circuits by using lead frames in place of substrates for mounting solder balls of ball grid array packages. Upper an lower conductors of the lead frames allow solder balls to be mounted on both the upper and lower portions of an IC package. Solder balls mounted on the upper portion of one package may then be connected to solder balls mounted on the lower portion of another package to achieve multiple stacking of IC packages.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. Apparatus for packaging a plurality of semiconductor integrated circuits, each integrated circuit having a semiconductor die with electronic circuitry disposed thereon, the apparatus comprising:

a first integrated circuit package;

a second integrated circuit package; the first and second integrated circuit packages each comprising a lead frame, including a plurality of conductors having upper and lower portions thereof, connected to the semiconductor die, a housing including apertures disposed therein for exposing at least one of the upper and the lower portions of the conductors of the lead frame, and conductive material disposed within the apertures coupled to the lead frame conductors for connecting the electronic circuitry disposed on the semiconductor die to components external to the housing via the lead frame conductors and the conductive material within the apertures;

wherein the conductive material coupled to the upper portions of the conductors of the lead frame of the first integrated circuit package is coupled to the conductive material coupled to the lower portions of the conductors of the lead frame of the second integrated circuit package.

2. Apparatus according to claim 1 wherein the conductive material comprises at least one solder ball of a ball grid array.

3. Apparatus according to claim 1 wherein the conductive material comprises at least one solder ball of a ball grid array.

4. Apparatus according to claim 1 wherein the housing is made of molded plastic.

* * * * *